United States Patent [19]

Rivoir

[11] Patent Number: 5,099,201
[45] Date of Patent: Mar. 24, 1992

[54] STRIPLINE TEST ADAPTER

[75] Inventor: Peter Rivoir, Esslinger, Fed. Rep. of Germany

[73] Assignee: Standard Elektrik Lorenz Aktiengesellschaft, Stuttgart, Fed. Rep. of Germany

[21] Appl. No.: 604,138

[22] Filed: Oct. 29, 1990

[30] Foreign Application Priority Data

Nov. 18, 1989 [DE] Fed. Rep. of Germany ....... 3938427

[51] Int. Cl.⁵ .......................................... G01R 27/04
[52] U.S. Cl. .................................. 324/629; 324/715; 333/161
[58] Field of Search ............... 324/629, 632, 637, 639, 324/715; 333/161

[56] References Cited
U.S. PATENT DOCUMENTS

| 3,440,573 | 4/1969 | Butler | 333/161 |
| 3,662,318 | 5/1972 | Decuyper | 339/17 R |
| 4,489,271 | 12/1984 | Riblet | 324/632 X |

FOREIGN PATENT DOCUMENTS

3134801A1  9/1981  Fed. Rep. of Germany .

OTHER PUBLICATIONS

Uberbacher and Short, "Crossover Connector" *IBM Disclosure Bulletin*, vol. 8, No. 8, p. 1059, Jan. 1966.
EPO Search Report, EP 90121766.1, four pages, Feb. 7, 1991.

*Primary Examiner*—Kenneth A. Wieder
*Assistant Examiner*—Glenn W. Brown
*Attorney, Agent, or Firm*—Spencer & Frank

[57] ABSTRACT

A test adapter is disclosed for connection to a measuring instrument using a 4-conductor measuring technique. It has four coaxial connectors whose characteristic impedance is adapted to that of the measuring instrument. The supply lines are designed as a stripline whose characteristic impedance is equal or approximately equal to that of the coaxial connectors.

19 Claims, 2 Drawing Sheets

STRIPLINE TEST ADAPTER

BACKGROUND OF THE INVENTION

1. Field of the Invention

The present invention relates to a test adapater for use with a measuring instrument.

2. Background Information

Test adapters are available from manufacturers and subsupplies of measuring instruments using the 4-conductor measuring technique. It is known to design the points of contact of the test section as resilient contact clips. Each of these contact clips is connected by a wire to the inner conductor of the associated coaxial connector. At the interfaces between the connector and the wire and between the wire and the point of contact, abrupt changes in the characteristic impedances of the lines occur, which result in undesired reflections that invalidate the measurement result. Furthermore, a potential in the vicinity of the test adapter, e.g., the operator's hand, may disturb the field in the area of the test adapter in such a way as to affect the measurement result.

SUMMARY OF THE INVENTION

It is the object of the present invention to design a test adapter of the above kind so that reflections along the wiring of the test adapter and disturbances of the resulting field distribution are avoided.

This object is attained by the provision of connecting means designed as striplines with matched characteristic impedance. Thereby practically no abrupt changes in characteristic impedance occur at the connecting points, so that reflections are avoided or occur only in a negligible order of magnitude. Moreover, the electromagnetic field produced in the area of the stripline is limited to a very small space, so that any interference from the outside is excluded.

BRIEF DESCRIPTION OF THE DRAWINGS

Further advantageous details of the invention will now be described with reference to the embodiments illustrated in the accompanying drawings, in which.

DETAILED DESCRIPTION OF THE PREFERRED EMBODIMENT(S)

Figure 1:
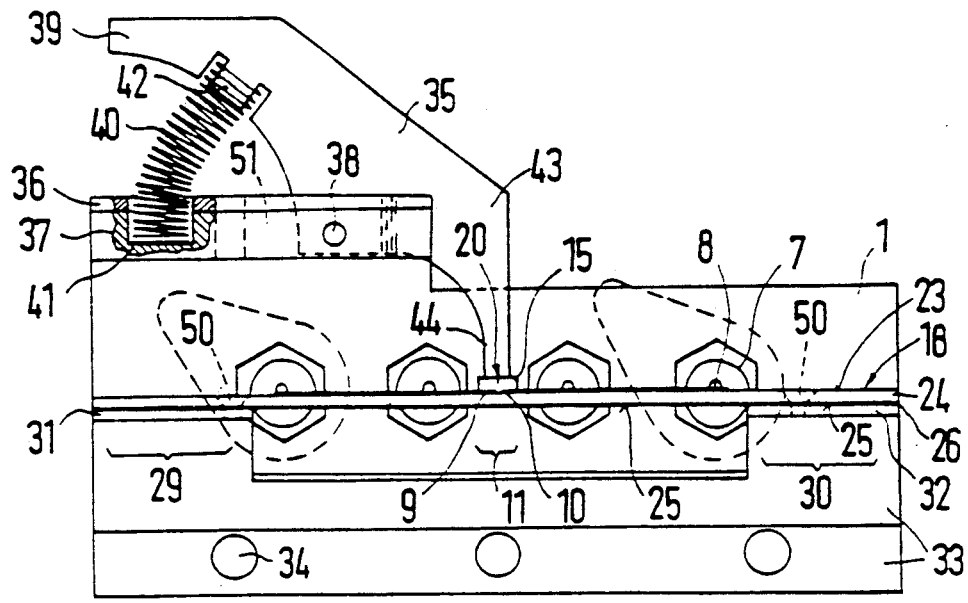
FIG. 1 is a view of the side of the test adapter opposite the coaxial connectors.
Figure 2:
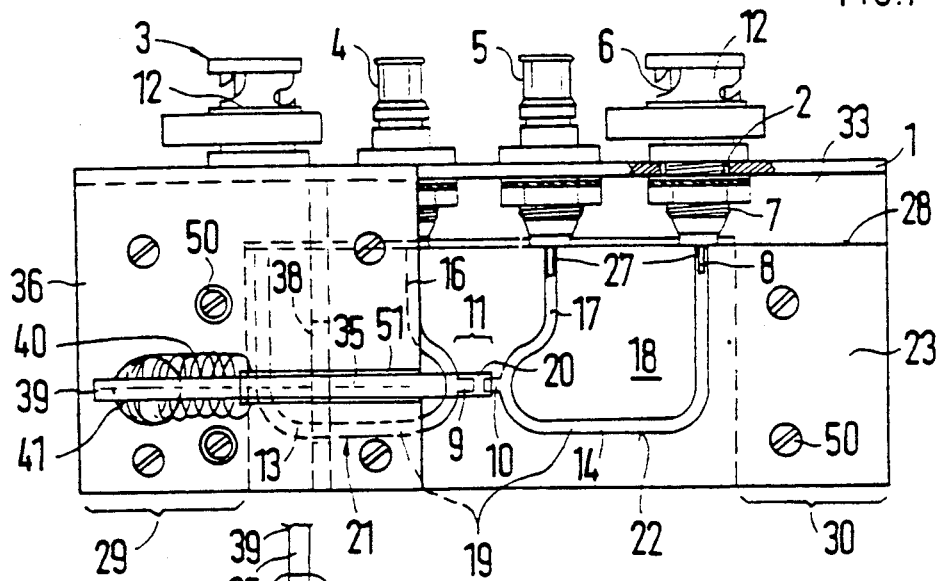
FIG. 2 is a top view of the test adapter of FIG. 1.
Figure 3:
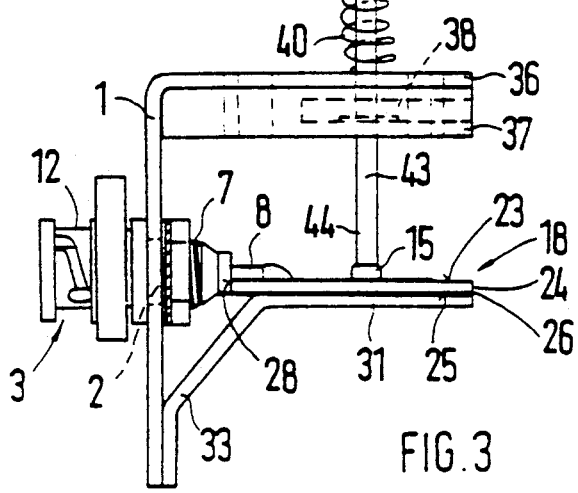
FIG. 3 is a view of the left-hand side of the test adapter of FIGS. 1 and 2.
Figure 4:
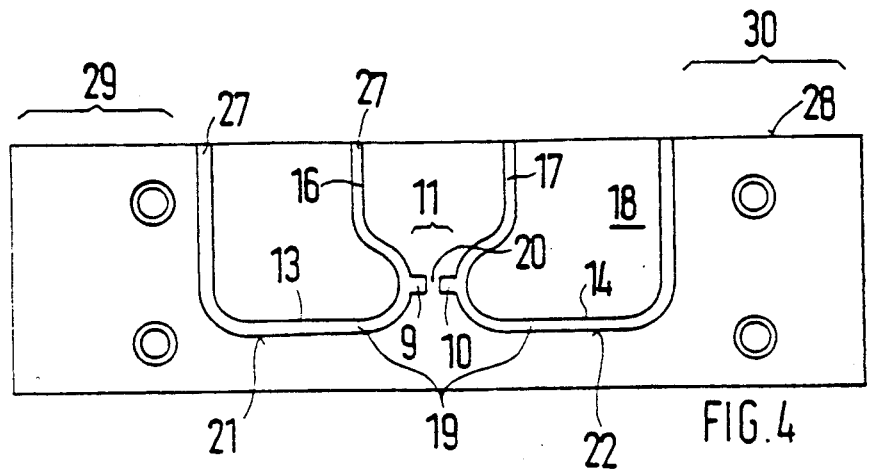
FIG. 4 is a top view of an embodiment using an unbalanced stripline.

In FIGS. 1 to 3, a support of a test adapter for a measuring instrument using the 4-conductor measuring technique is designated 1. It is preferably made of metal and has four holes 2 arranged along a straight line. In these holes, coaxial connectors 3, 4, 5, and 6, e.g., in the form of BNC panel connectors, are inserted. Each of them is fastened to the support 1 by a bolted joint 7 in a manner known per se. The support 1 also serves as a common voltage bus for all coaxial connectors 3 to 6, said voltage bus being commonly grounded. The coaxial connectors 3 to 6 have a characteristic impedance adapted to that of the measuring instrument to which the test adapter is to be connected. For example, the characteristic impedance will be 50 ohms if the characteristic impedance or the internal or source impedance of the measuring instrument is 50 ohms or approximately 50 ohms.

The inner-conductor portions 8 protruding from the bolts of the bolted joints 7 of the coaxial connectors 3 to 6 are connected to contact points 9 and 10 of a test section 11 in accordance with the 4-conductor measuring technique: The two outer coaxial connectors 3 and 6, which are provided with a bayonet socket 12, for example, are connected to the contact points 9 and 10 via lines 13 and 14, respectively. The test section 11 is bridged by an inserted electric component 15 or network to be measured, on which a test current is impressed via the coaxial connectors 3 and 6. One of the inner coaxial connectors, 4, is connected to the contact point 9 via a test line 16, and the other, 5, is connected to the contact point 10 via a test line 17. Via these two test lines 16, 17 and coaxial connectors 4, 5, the voltage developed across the component 15 by the flow of the test current through the latter can be measured.

According to the invention, the lines 13 and 14 are implemented as a stripline 18 whose characteristic impedance is equal or approximately equal to that of the coaxial connectors 3 and 6. In the above-assumed case of 50 ohms, the characteristic impedance of the stripline is also 50 ohms or at least approximately 50 ohms. The lines 13 and 14 form the inner conductor 19, which is open at a point 20, whereby the test section 11 is formed. The contact points 9 and 10 are formed, respectively, by the portions 21 and 22 of the inner conductor 19, which end there.

The gold-plated inner conductor 19 and the test lines 16 and 17 are formed on one side 23 of an insulating board 24, e.g., in the manner of a printed circuit. The other side 25 of the insulating board 24 is covered with the outer conductor 26, e.g., a gold-plated copper foil, which advantageously extends over the entire area of this side 25.

To obtain as continuous a transition as possible between the coaxial connectors 3 to 6 and the inner conductor 19 or the test lines 16 and 17, the terminals 27 of the inner conductor 19 and of the test lines 16 and 17 are brought to that edge of the insulating board 24 which is adjacent to the bolted joints 7, i.e., the edge 28, where they are soldered and/or bonded to the associated inner-conductor portions 8 of the coaxial connectors 3 to 6.

Sections 29 and 30 of the stripline 18, which form the lateral end portions of the insulating board 24, rest, via the outer conductor 26, which extends into these sections 29, 30, on contact plates 31 and 32, respectively, which are fastened to the support 1. The stripline 18 is thus permanently and conductively connected with these contact plates 31, 32. The latter are advantageously arranged so as not to extend into the range of action of the stripline 18 or the inner conductor 19 thereof. The contact plates 31, 32 may be part of the support 1 or formed by a suitably angled element. In the embodiment shown, they form part of an angle bar 33 which is permanently and conductively joined, e.g., welded, to the support 1.

According to an advantageous aspect of the invention, the test lines 16 and 17, too, may be designed as striplines having a characteristic impedance adapted to that of the coaxial connectors 4 and 5, respectively.

To simplify the insertion of, and make contact to, the component 15 or a network, a pressure element in the form of, e.g., a pivoted lever 35 is provided above the break 20 in the inner conductor 19. It is pivoted to a portion 36 of the support 1 which extends over the stripline 18 at a distance from the latter, or, as in the embodiment shown, on a shaft 38 in a holding body 37 fastened, e.g., screwed, to the portion 36 and preferably made of insulating material. The portion 36 or the holding body 37 should not cover the test section 11. Between the laterally upwardly extending arm 39 and the portion 36 or the holding body 37, a compression spring 40 in the form of a spiral spring is mounted. To fix the compression spring 40 in position, the portion 36 or the holding body 37 contains a blind hole 41, and the arm 39 has a guide portion 42. A slot 51 in the holding body 37 or the portion 36 serves to guide the pivoted lever 35.

By the compression spring 40, the pivoted lever 35 is preloaded clockwise about the axis of the shaft 38, so that a pin-shaped end portion 44 of the arm 43, which is movable downwardly against the break 20 or the component 15 located there, can press the inserted component 15 with its terminals against the contact points 9, 10.

Figure 5:
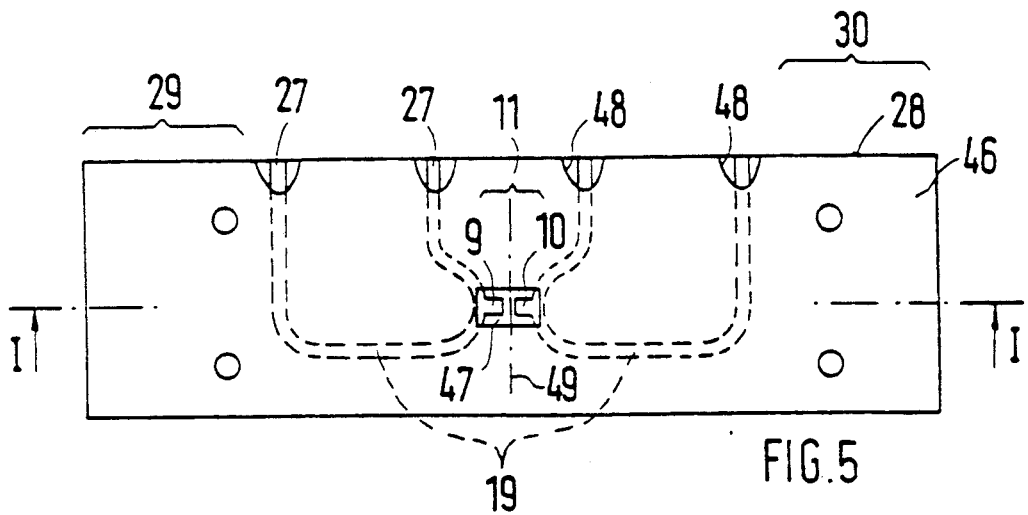
FIG. 5 is a top view of an embodiment using a balanced stripline.
Figure 6:
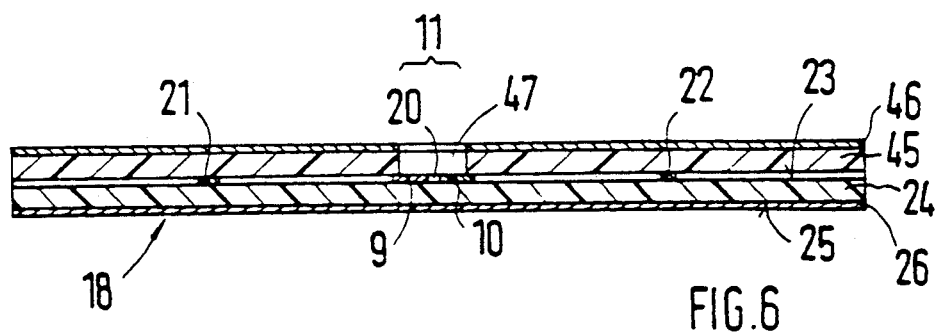
FIG. 6 is a section taken along line I—I of FIG. 5.

The stripline 18 and the test lines 16, 17 may be designed in the form of an unbalanced stripline, as shown in FIGS. 1 to 4. To achieve even better shielding, they may advantageously be designed as a balanced stripline, as shown by way of example in FIGS. 5 and 6. As shown in FIG. 6, such a stripline consists of a stripline 18 as described above, i.e., an insulating board 24 with the outer conductor 26 and the inner conductor 19, and a second insulating board 45 on top thereof, which is provided with an outer conductor 46. The insulating board 45 is joined to the stripline 18 by a suitable adhesive, e.g., an epoxy adhesive or any other adhesive having good dielectric properties. The outer conductor 46 is connected via the contact plates 31, 32 to the voltage bus 1 or the same potential in a suitable manner, e.g., by the fastening screws 50.

Above the break 20, the insulating board 45 has an opening 47 in the area of the test section 11. Into this opening, a component 15 can be inserted in order to make contact to the contact points 9, 10 of the inner conductor 19 and perform the measuring operation. The insulating board 45 is designed so that contact can be made to the terminal 27 of the inner conductor 19 and of the test lines 16, 17. In the embodiment shown, the insulating board 45 has tongue-shaped recesses 48 for this purpose (FIG. 5). The recesses 48 are preferably shaped so that no abrupt change in characteristic impedance will occur there. This can be achieved, for example, by forming wedge-shaped, parabolic, or elliptic recesses 48 in the outer conductor 46 or in both the insulating board 45 and the outer conductor 46.

According to a further advantageous aspect of the invention, the break 20 is located in the middle or approximately in the middle of the inner conductor 19 and divides the latter into equal sections 21, 22, which may preferably be symmetrical about the dividing line 49 of the break 20, as shown in the embodiments.

The test adapter according to the invention is especially suited for measuring surface-mounting components. Particularly surface-mounting coils with low inductances can be measured with high accuracy, because the stripline has very low self-inductance.

I claim:

1. A test adapter for connection to a measuring instrument for measuring at a test section the electrical values of an electric component or network under test, comprising:
   four coaxial connectors arranged as two inner and two outer connectors along a straight line on a common support and extending in the same direction each having a characteristic impedance adapted to that of the measuring instrument;
   first connection means connected to the two outer coaxial connectors for providing an electrical path so that each of the two outer coaxial connectors may be connected to the test section at first points of contact and through which a component to be tested can be supplied with a test current;
   second connection means for providing an electrical path by which the voltage developed across the component by the test current can be measured, connected to the two inner coaxial connectors so that each may be connected to the test section at second points of contact;
   said first connection means being first and second stripline portions whose characteristic impedances are equal or approximately equal to that of the associated outer coaxial connectors, and whose respective inner conductors are separated by a break for forming the test section;
   wherein above the break forming the test section, a pressure element having a spring is provided for pressing an insertable component to be tested between the pressure element and the break with the component's terminals against the points of contact.

2. A test adapter as claimed in claim 1, wherein the second connection means are third and fourth stripline portions whose characteristic impedances are equal or approximately equal to that of the associated inner coaxial connector.

3. A test adapter as claimed in claim 2, wherein terminals of the first and second connection means are brought to an edge of a substrate on which the stripline portions are formed, and are soldered to the associated coaxial connectors.

4. A test adapter as claimed in claim 1, wherein those ends of portions of the inner conductors which are located in the rear of the test section form the points of contact.

5. A test adapter as claimed in claim 4, wherein said portions of the respective inner conductors are symmetrical about the break.

6. A test adapter as claimed in claim 4, wherein at least the points of contact of the test section are gold-plated.

7. A test adapter as claimed in claim 1, wherein the stripline portions are unbalanced striplines.

8. A test adapter as claimed in claim 1, wherein the pressure element is pivoted to a support, a portion of the support to which the pressure element is pivoted extending over the stripline portions but not covering the test section.

9. A test adapter as claimed in claim 8, wherein the pressure element is a spring-loaded pivoted lever.

10. A test adapter as claimed in claim 9, wherein one arm of the pivoted lever has a pin-shaped end portion movable against the area of the break, and that a spring producing the tension is mounted between the other arm and said portion of the support.

11. A test adapter as claimed in claim 1, wherein the break is provided in the middle of the respective inner conductors.

12. A test adapter for connection to a measuring instrument for measuring at a test section the electrical values of an electric component or network under test, comprising:
  four coaxial connectors arranged as two inner and two outer connectors along a straight line on a common support and extending in the same direction each having a characteristic impedance adapted to that of the measuring instrument;
  first connection means connected to the two outer coaxial connectors for providing an electrical path so that each of the two outer coaxial connectors may be connected to the test section at first points of contact and through which a component to be tested can be supplied with a test current;
  second connection means for providing an electrical path by which the voltage developed across the component by the test current can be measured, connected to the two inner coaxial connectors so that each may be connected to the test section at second points of contact;
  said first connection means being first and second stripline portions whose characteristic impedances are equal or approximately equal to that of the associated outer coaxial connectors, and whose respective inner conductors are separated by a break for forming the test section;
  wherein the coaxial connectors are conductively connected to a common voltage bus by bolted joints, and, the voltage bus is conductively connected to at least one section of outer conductors of the stripline portions.

13. A test adapter as claimed in claim 12, wherein the at least one section of the outer conductors extends outwardly from the outer coaxial connectors and rests on and is permanently and conductively connected with contact plates of the voltage bus which extend into the area of the at least one section of the outer conductors.

14. A test adapter as claimed in claim 12, wherein the stripline portions are each formed as a balanced stripline one side of which has, in the area of the test section, an opening into which a component is insertable for making contact to the points of contact of the test section, and which is designed so that the terminals of the inner conductors of the first and second connection means can be contacted, particularly soldered, to the inner conductors of the associated coaxial connectors, and that outer conductors of the balanced striplines are conductively connected to the voltage bus.

15. A test adapter as claimed in claim 12, wherein the common support forms the voltage bus.

16. A test adapter as claimed in claim 12, wherein the second connection means are third and fourth stripline portions whose characteristic impedances are equal or approximately equal to that of the associated inner coaxial connector.

17. A test adapter as claimed in claim 12, wherein those ends of portions of the inner conductors which are located in the rear of the test section form the points of contact.

18. A test adapter as claimed in claim 12, wherein the stripline portions are unbalanced striplines.

19. A test adapter as claimed in claim 12, wherein the break is provided in the middle of the respective inner conductors.

* * * * *